(12) United States Patent
Toyama et al.

(10) Patent No.: US 11,424,068 B2
(45) Date of Patent: Aug. 23, 2022

(54) INDUCTOR

(71) Applicant: Murata Manufacturing Co., Ltd., Kyoto-fu (JP)

(72) Inventors: Motoki Toyama, Nagaokakyo (JP); Takumi Arai, Nagaokakyo (JP); Ryuta Uematsu, Nagaokakyo (JP); Yuichi Tsuchiya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 414 days.

(21) Appl. No.: 16/805,539

(22) Filed: Feb. 28, 2020

(65) Prior Publication Data
US 2020/0279688 A1 Sep. 3, 2020

(30) Foreign Application Priority Data

Mar. 1, 2019 (JP) .............................. JP2019-037629
Jan. 24, 2020 (JP) .............................. JP2020-010037

(51) Int. Cl.
| H01F 17/06 | (2006.01) |
| --- | --- |
| H01F 27/02 | (2006.01) |
| H01F 27/29 | (2006.01) |
| H05K 1/18 | (2006.01) |
| H01F 41/02 | (2006.01) |
| H01F 17/04 | (2006.01) |

(52) U.S. Cl.
CPC .......... *H01F 27/292* (2013.01); *H01F 17/06* (2013.01); *H01F 27/027* (2013.01); *H01F 41/0246* (2013.01); *H05K 1/181* (2013.01); *H01F 2017/048* (2013.01)

(58) Field of Classification Search
CPC .. H01F 17/06; H01F 2017/048; H01F 27/027; H01F 27/292; H01F 27/02; H01F 27/29; H01F 17/04; H01F 41/0246; H01F 41/02; H01F 41/005; H01F 3/10; H01F 27/2847; H05K 1/181; H05K 1/18; Y10T 29/49076
USPC ...................... 336/192, 200, 233, 83; 29/608
See application file for complete search history.

(56) References Cited

U.S. PATENT DOCUMENTS

| 2008/0012674 A1* | 1/2008 | Sano | H05K 1/0233 |
| --- | --- | --- | --- |
| | | | 336/83 |
| 2019/0272947 A1* | 9/2019 | Uematsu | H01F 27/2847 |
| 2020/0373075 A1* | 11/2020 | Ohtsubo | H01F 41/12 |

FOREIGN PATENT DOCUMENTS

| JP | H01-135727 | * | 9/1989 | ............. H01G 4/252 |
| --- | --- | --- | --- | --- |
| JP | 06096956 A | * | 4/1994 | ............. H01F 17/04 |
| WO | 2009/075110 A1 | | 6/2009 | |

* cited by examiner

*Primary Examiner* — Timothy J Thompson
*Assistant Examiner* — Guillermo J Egoavil
(74) *Attorney, Agent, or Firm* — Studebaker & Brackett PC (57) ABSTRACT

An inductor includes a main body having a bottom surface, a top surface positioned opposite to the bottom surface, four side surfaces connected to the bottom surface and the top surface, a metal body that includes a first metal portion buried in the main body and second metal portions extending outward from respective opposite longitudinal ends of the first metal portion. The second metal portions are exposed from respective opposite side surfaces of the main body. In the inductor, each second metal portion is formed into a tabular shape having a first surface with a plating layer and a second surface positioned opposite to the first surface. Each second metal portion is formed into an external terminal and includes a first bend and a second bend that are formed by bending the second metal portion.

10 Claims, 4 Drawing Sheets

INDUCTOR

CROSS-REFERENCE TO RELATED APPLICATIONS

This application claims benefit of priority to Japanese Patent Application No. 2019-037629, filed Mar. 1, 2019 and Japanese Patent Application No. 2020-010037, filed Jan. 24, 2020, the entire content of which is incorporated herein by reference.

BACKGROUND

Technical Field

The present disclosure relates to an inductor and more particularly to a surface-mount inductor.

Background Art

An inductor used for a power supply circuit is desired to have a low inductance in high frequencies and to handle a large electric current. For this purpose, there is provided an inductor having a main body containing metallic magnetic powder and a metal plate buried in the main body with both end portions of the metal plate being taken out from the main body, and the end portions are bent along corresponding side surfaces and the bottom surface of the main body and are configured to serve as external terminals as described, for example, in WO2009/075110).

This type of known inductor typically has a plating layer on each external terminal to improve solder wettability when the inductor is mounted on a printed circuit board by soldering.

In manufacturing this type of inductor, each external terminal is formed by bending a corresponding end portion of the metal plate taken out from the main body. During the bending of the metal plate, forces act in a direction of stretching the plating layer at a bent portion. Accordingly, cracks tend to occur in the plating layer at the bent portion. Forces acting on the metal plate during bending become larger for a smaller inductor, which tends to cause cracks more frequently. As a result of crack generation in the surface plating layer of the external terminal, a soldering failure may occur due to poor solder wettability when the inductor is mounted on a printed circuit board by soldering.

SUMMARY

Accordingly, the present disclosure provides an inductor that can suppress crack generation in plating layers of external terminals that are taken out from a metal body buried in a main body and that have bend portions formed therein.

According to preferred embodiments of the present disclosure, an inductor includes a main body having a bottom surface, a top surface positioned opposite to the bottom surface, four side surfaces connected to the bottom surface and the top surface, a metal body that includes a first metal portion buried in the main body and second metal portions extending outward from respective opposite longitudinal ends of the first metal portion. The second metal portions are exposed from respective opposite side surfaces of the main body. In the inductor, each second metal portion is formed into a plate-like (tabular) shape having a first surface with a plating layer and a second surface positioned opposite to the first surface. Each second metal portion is formed into an external terminal and includes a first bend that is formed by bending the second metal portion such that the second surface opposes a corresponding one of the opposite side surfaces of the main body and also includes a second bend that is formed by bending the second metal portion such that the second surface opposes the bottom surface of the main body. When R1 denotes a curvature radius of an inner peripheral surface of the second bend, t denotes a thickness of each second metal portion at the second bend, $\lambda$ denotes a value determined based on the ratio R1 to t, and $\lambda$ is 0.3 in the case of R1/t being less than 0.5, or 0.35 in the case of R1/t being in the range of 0.5 or more to less than 1.5 (i.e., from 0.5 to less than 1.5), or 0.43 in the case of R1/t being in the range of 1.5 or more to less than 3.0 (i.e., from 1.5 to less than 3.0), or 0.5 in the case of R1/t being 5.0 or more, then a curvature radius R2 of a neutral surface of bending of the second bend is obtained from a formula: $R2=R1+\lambda \times t$, and a curvature radius R3 of an outer peripheral surface of the second bend is obtained from a formula: $R3=R1+t$. When a first distance A is defined as a distance between an end of the first bend that is closer to a tip of each second metal portion and an end of the second bend that is closer to the first metal portion, and when a second distance B is defined as a distance between the tip of each second metal portion and an end of the second bend that is closer to the tip of each second metal portion, a length of the neutral surface is obtained by $A+B+R2\times 2\times\pi\times 90°/360°$, and a total length of the first distance A, the second distance B, and the outer peripheral surface of the second bend is obtained by $A+B+R3\times 2\times\pi\times 90°/360°$. When an elongation percentage $\varepsilon$ of the outer peripheral surface is defined as {(the length of the outer peripheral surface−the length of the neutral surface)/the length of the outer peripheral surface}×100, the first distance A is set to be shorter than a length of the corresponding one of the opposite side surfaces of the main body measured in a direction orthogonally intersecting the bottom surface and the second distance B is set to be shorter than a half of a distance between the opposite side surfaces of the main body, the elongation percentage $\varepsilon$ of outer peripheral surface is 13% or less.

Other features, elements, characteristics and advantages of the present disclosure will become more apparent from the following detailed description of preferred embodiments of the present disclosure with reference to the attached drawings.

DETAILED DESCRIPTION

Embodiments and examples for implementing the present disclosure will be described with reference to the drawings. Note that an example inductor is described below for realizing the technical idea of the present disclosure, but the present disclosure is not limited to the inductor described below unless expressly stated otherwise.

In the drawings, elements having the same function may be denoted by the same reference symbols. Different embodiments and examples may be described separately for convenience for the sake of explaining main points or facilitating a clear understanding. However, the different embodiments and examples can be partially replaced by or partially combined with each other. Embodiments and examples described later are based on preceding description of embodiments. In this case, only differences will be described and duplicated descriptions will be omitted. Advantageous effects obtained by a similar configuration will not be described repeatedly for each embodiment or example. Sizes and positional relationships of members in the drawings may be exaggerated to facilitate a clear understanding.

First Embodiment

An inductor according to a first embodiment of the present disclosure will be described with reference to FIG. 1, FIGS. 2A to 2C, and FIG. 3.

Figure 1:
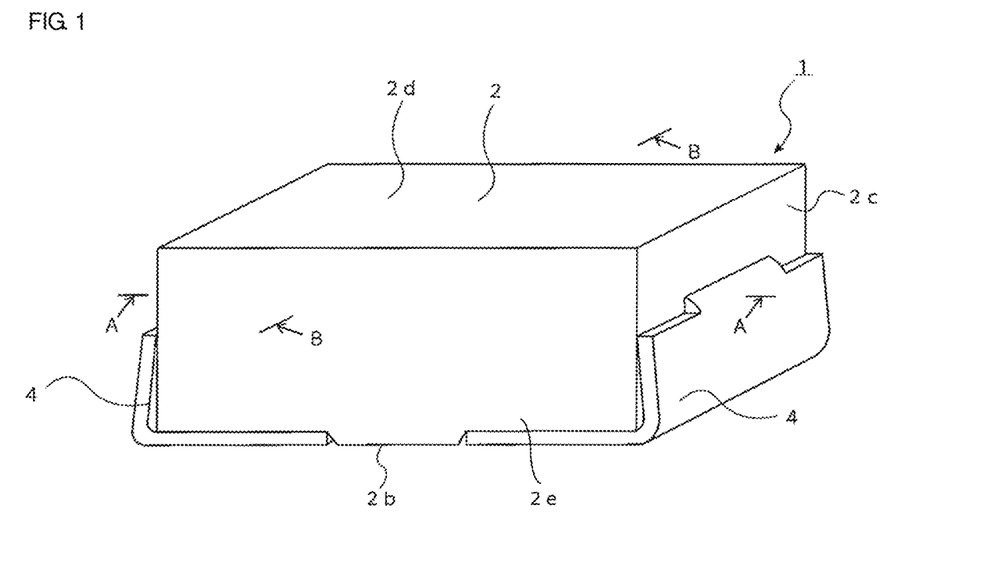
FIG. 1 is a perspective view schematically illustrating an inductor according to a first embodiment of the present disclosure.
Figure 2A:
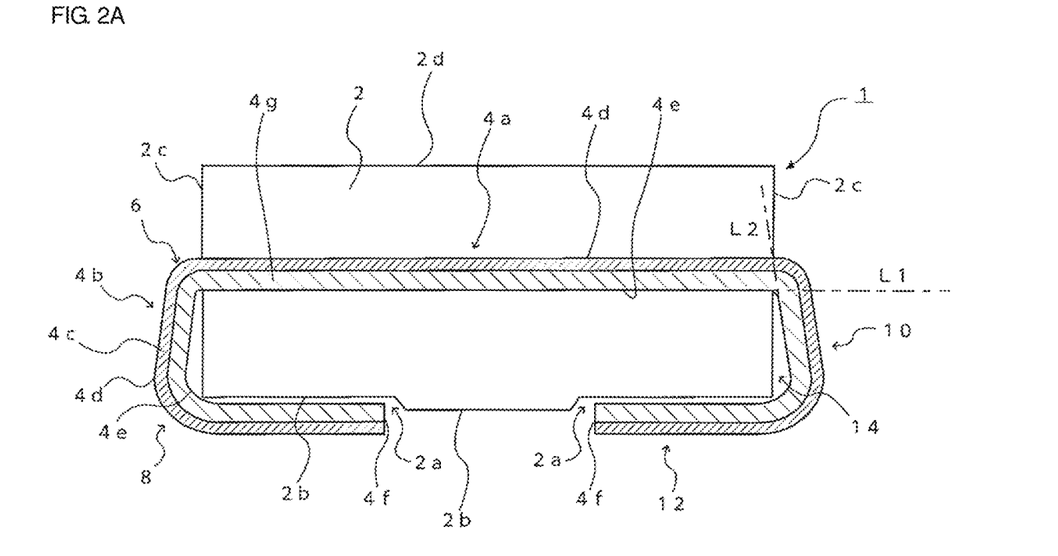
FIG. 2A is a cross-sectional view schematically illustrating the inductor cut along line A-A in FIG. 1.
Figure 2B:
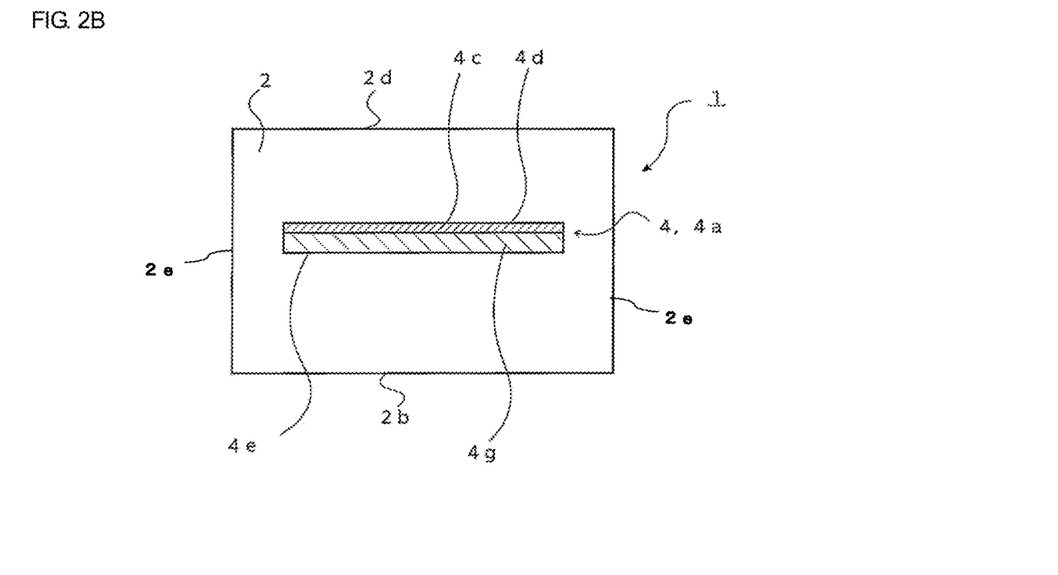
FIG. 2B is a cross-sectional view schematically illustrating the inductor cut along line B-B in FIG. 1.
Figure 2C:
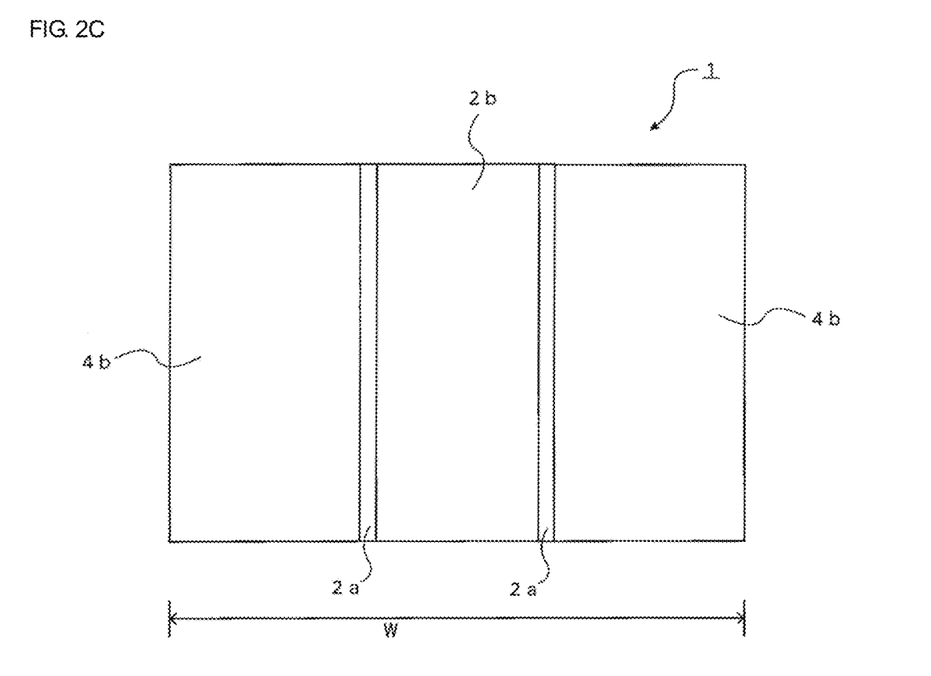
FIG. 2C is a bottom view schematically illustrating the inductor of FIG. 1.
Figure 3:
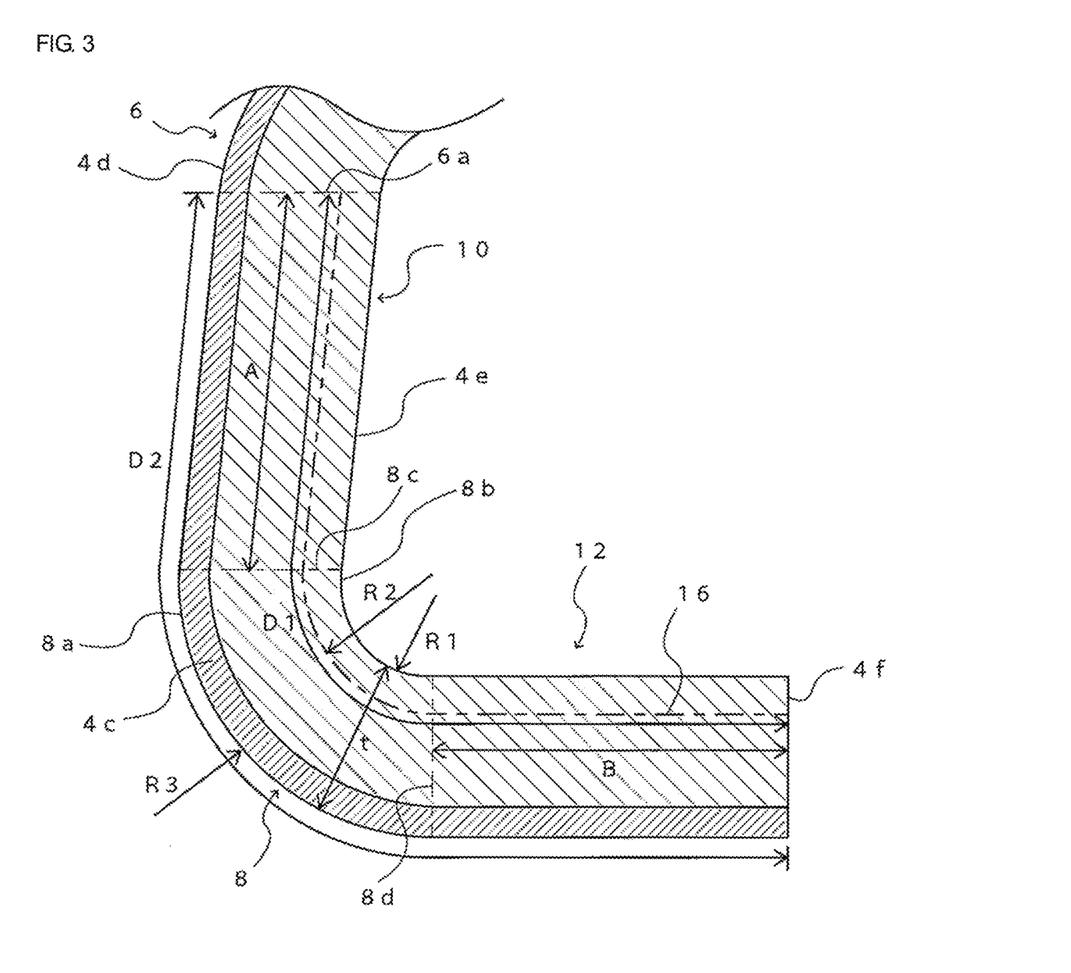
FIG. 3 is a detailed cross-sectional view illustrating part of a second metal portion of the inductor of FIG. 1, which is exposed to the outside of a main body.

FIG. 1 is a perspective view schematically illustrating an inductor according to a first embodiment of the present disclosure. FIG. 2A is a cross-sectional view schematically illustrating the inductor cut along line A-A in FIG. 1. FIG. 2B is a cross-sectional view schematically illustrating the inductor cut along line B-B in FIG. 1. FIG. 2C is a bottom view schematically illustrating the inductor of FIG. 1. FIG. 3 is a detailed cross-sectional view illustrating part of a second metal portion of the inductor of FIG. 1, which is exposed to the outside of a main body.

An inductor 1 according to the present embodiment is a surface-mount inductor that includes a main body 2. The main body 2 includes a bottom surface 2b, a top surface 2d positioned opposite to the bottom surface 2b, and four side surfaces connected to both the bottom surface 2b and the top surface 2d. The inductor 1 also includes a metal body 4. The metal body 4 further includes a first metal portion 4a buried inside the main body 2 and second metal portions 4b that extend from both ends of the first metal portion 4a in the longitudinal direction thereof. The second metal portions 4b are exposed respectively from opposite side surfaces 2c of the main body 2. The metal body 4 is formed into a tabular shape having a first surface 4d and a second surface 4e that are opposite to each other. The first surface 4d is a surface of a plating layer 4c of the metal body 4. Each of the second metal portions 4b includes a first bend 6 and a second bend 8. The first bend 6 is formed by bending the second metal portions 4b such that the second surface 4e opposes one of the side surfaces 2c of the main body 2, and the second bend 8 is formed by bending the second metal portions 4b such that the second surface 4e opposes the bottom surface 2b of the main body 2. The second metal portions 4b are formed as external terminals which extend along the main body 2 from respective side surfaces 2c to the bottom surface 2b.

Main Body

The main body 2 is shaped like a cuboid. The main body 2 includes a rectangular bottom surface 2b having longitudinal sides and lateral sides and a rectangular top surface 2d positioned opposite to the bottom surface 2b and having longitudinal sides and lateral sides. The main body 2 also includes two rectangular side surfaces 2e positioned opposite to each other and connected to respective longitudinal sides of the bottom surface 2b and two rectangular side surfaces 2c positioned opposite to each other and connected to respective lateral sides of the bottom surface 2b. The side surfaces 2c substantially orthogonally intersect the bottom surface 2b. The bottom surface 2b has two recesses 2a formed for accommodating part of the second metal portions 4b of the metal body 4. The recesses 2a are formed in the bottom surface 2b in regions closer to respective side surfaces 2c with respect to the center of the bottom surface 2b in the longitudinal direction. Accordingly, the bottom surface 2b is constituted by the low bottom surfaces of the recesses 2a and a high central region that connects the recesses 2a to each other. As illustrated in FIG. 2C, in the longitudinal direction of the main body 2, the length of each recess 2a is less than a half of the longitudinal length W of the main body 2 and is more than or equal to the longitudinal length of a second straight portion 12 of a second metal portion 4b, which will be described later.

The main body 2 is formed of a composite material containing a magnetic powder. The magnetic powder is, for example, a metallic magnetic substance containing iron, an amorphous metal, metallic magnetic particles such as nanocrystals, or ferrite powder. The composite material may further contain a binder such as a resin. An example of the resin is a thermosetting resin such as epoxy resin. The main body 2 according to the present embodiment has, for example, a size of 2.5 mm by 2.0 mm by 1.0 mm (so called "252010 size"). More specifically, the longitudinal length of the main body 2 is 2.5 mm, and the lateral length thereof is 2.0 mm, and the distance (thickness) between the bottom surface 2b and the top surface 2d positioned opposite to the bottom surface 2b is 1.0 mm Metal Body The metal body 4 is formed into a tabular shape having longitudinal sides and lateral sides and includes the first surface 4d covered with the plating layer 4c and the second surface 4e opposite to the first surface 4d. The metal body 4 further includes the first metal portion 4a positioned in a central region of the metal body 4 in the longitudinal direction and also includes two second metal portions 4b that continue to respective opposite ends of the first metal portion 4a in the longitudinal direction.

The metal body 4 is constituted by a base metal 4g that is made of copper and also by the plating layer 4c that is formed so as to entirely cover one principal surface of the base metal 4g to a thickness of, for example, 150 μm. The lateral length of the metal body 4 is configured such that the first metal portion 4a and the second metal portions 4b have different dimensions. For example, in the lateral direction of the metal body 4, the length of the first metal portion 4a can be 600 μm and the length of the second metal portions 4b can be 2000 μm. The plating layer 4c of the metal body 4 includes a first layer that is formed of nickel (Ni) plating so as to be in contact with the base metal 4g and a second layer that is formed of tin (Sn) plating so as to cover the first layer.

First Metal Portion

The first metal portion 4a is buried in the main body 2 in such a manner that the second surface 4e of the first metal portion 4a extends substantially parallel to the bottom surface 2b of the main body 2. Here, the plating layer 4c of the first metal portion 4a is disposed so as to face in a direction opposite to the bottom surface 2b of the main body 2. The first metal portion 4a functions as a conductor for a coil. In the longitudinal direction of the main body 2, the length of the first metal portion 4a is substantially the same as the length of the main body 2. The lateral length of the first metal portion 4a is shorter than the lateral length of the main body 2, as illustrated in FIG. 2B.

Second Metal Portion

The second metal portions 4b are extended outward from respective side surfaces 2c of the main body 2 and are formed as external terminals. Each of the second metal portions 4b includes a first bend 6 and a second bend 8. The first bend 6 is formed by bending the second metal portions 4b such that the second surface 4e opposes one of the side surfaces 2c of the main body 2, and the second bend 8 is formed by bending the second metal portions 4b such that the second surface 4e opposes the bottom surface 2b of the main body 2. The second metal portion 4b is formed so as to have different lateral lengths at the first bend 6 and at the portion other than the first bend 6. The lateral length of the first bend 6 is substantially the same as the lateral length of the first metal portion 4a, and the lateral length of the portion other than the first bend 6 is larger than the lateral length of the first metal portion 4a. In addition, the lateral length of the second metal portion 4b other than the first bend 6 is substantially the same as, or slightly smaller than, the lateral length of the main body 2. Moreover, as illustrated in FIG. 3, each second metal portion 4b includes a first straight portion 10 formed between an end 6a of the first bend 6 that is the end closer to a tip 4f of the second metal portions 4b and an end 8c of the second bend 8 that is the end closer to the first metal portion 4a. The length (first distance A) between the end 6a of the first bend 6 and the end 8c of the second bend 8, in other words, the longitudinal length of the first straight portion 10, is made shorter than the distance between the bottom surface 2b and the top surface 2d of the main body 2 illustrated in FIG. 2A (i.e., the height of the main body 2). In addition, as illustrated in FIG. 3, each second metal portion 4b includes a second straight portion 12 formed between the tip 4f of the second metal portion 4b and an end 8d of the second bend 8 that is the end closer to the tip 4f of the second metal portion 4b. The length (second distance B) between the tip 4f of the second metal portion 4b and the end 8d of the second bend 8, in other words, the longitudinal length of the second straight portion 12, is made shorter than a half of the longitudinal length W of the main body 2 illustrated in FIG. 2C. At least part of each second metal portion 4b, especially the second straight portion 12 positioned at the bottom surface 2b, is utilized for connecting the inductor 1 to the circuit of a printed circuit board.

First Bend

The first bend 6 is formed by bending each second metal portion 4b such that the second surface 4e of the second metal portion 4b opposes one of the side surfaces 2c of the main body 2. Note that in the present embodiment, as illustrated in FIG. 2A, the first bend 6 is formed by bending the second metal portion 4b such that the first bend 6 has an obtuse internal angle. Here, the internal angle of the first bend 6 is an angle between a straight line L1 extending longitudinally along the second surface 4e of the first metal portion 4a and a straight line L2 extending longitudinally along the second surface 4e of the first straight portion 10 that connects the first bend 6 and the second bend 8 to each other. In other words, the first bend 6 is formed by bending the second metal portion 4b such that the second surface 4e of the first straight portion 10 is not parallel to the corresponding side surface 2c of the main body 2 and that the second surface 4e and the side surface 2c form a predetermined angle. A gap 14 is thereby formed between the first straight portion 10 and the side surface 2c of the main body 2. However, the present disclosure is not limited to this configuration. The first bend 6 may be formed by bending the second metal portion 4b such that the internal angle substantially becomes a right angle and the second surface 4e of the first straight portion 10 thereby comes into contact with the side surface 2c of the main body 2.

Second Bend

The second bend 8 is formed by bending each second metal portion 4b such that the second surface 4e of the second metal portion 4b opposes the bottom surface 2b of the main body 2. As illustrated in FIG. 2A, the second bend 8 is formed by bending the second metal portion 4b such that after bending, the second surface 4e of second straight portion 12 of the second metal portion 4b is positioned substantially parallel to the bottom surface of the corresponding recess 2a formed as the bottom surface 2b of the main body 2. Each second straight portion 12 is accommodated in the corresponding recess 2a of the main body 2 in its entire length. In the case of the internal angle of the first bend 6 being formed as an obtuse angle, the internal angle of the second bend 8 can be formed as an acute angle so as to enable the second surface 4e of the second straight portion 12 to be substantially parallel to the bottom surface 2b of the main body 2.

Next, the second bend 8 will be described more specifically with reference to FIG. 3.

The second bend 8 has an outer peripheral surface 8a formed by the first surface 4d and an inner peripheral surface 8b formed by the second surface 4e. When subjected to bending, the second bend 8 has a neutral surface 16 generated between the outer peripheral surface 8a and the inner peripheral surface 8b. The neutral surface 16 is a surface at which no extension nor compression occurs during bending. Tensile stresses occur in a region of the second bend 8 outside the neutral surface 16 (i.e., a region near the outer peripheral surface 8a), and compressive stresses occur in a region of the second bend 8 inside the neutral surface 16 (i.e., a region near the inner peripheral surface 8b).

When R1 is the radius of curvature of the inner peripheral surface 8b, t is the distance between the outer peripheral surface 8a and the inner peripheral surface 8b at the second bend 8, in other words, the thickness of the second metal portion 4b at the second bend 8 (hereinafter referred to as the "thickness of the second bend 8"), and λ is a value determined based on the ratio of radius R1 of the inner peripheral surface 8b to the thickness t, the radius R2 of curvature of the neutral surface 16 and the radius R3 of curvature of the outer peripheral surface 8a can be obtained from the following formulas:

$$R2 = R1 + \lambda \times t$$

$$R3 = R1 + t$$

where, λ, which is determined based on the ratio of radius R1 of the inner peripheral surface to thickness t of the second bend 8, is 0.3 when R1/t is less than 0.5, 0.35 when R1/t is in the range of 0.5 to less than 1.5, 0.43 when R1/t is in the range of 1.5 to less than 3.0, or 0.5 when R1/t is 5.0 or more (based on information from MISUMI Group Inc. http://jp.misumi-ec.com/tech-info/categories/press_mold_design/pr03/c0091.html).

Next, the longitudinal length D1 of the neutral surface 16 and the longitudinal length D2 of the outer peripheral surface 8a at the second bend 8 are obtained as described below using the first distance A, which is the longitudinal length of the first straight portion 10, and the second distance B, which is the longitudinal length of the second straight portion 12. Note that when the gap 14 is formed as described above, the internal angle of the second bend 8 can be an acute angle. However, the internal angle of the second bend 8 can be approximated to 90 degrees because the dimensions of the inductor 1 according to the present embodiment are in the order of several millimeters. Accordingly, the longitudinal length D1 of the neutral surface 16 and the longitudinal length D2 of the outer peripheral surface 8a can be obtained from the following formulas:

$$D1 = A + B + R2 \times 2 \times \pi \times 90°/360°$$

$$D2 = A + B + R3 \times 2 \times \pi \times 90°/360°$$

An elongation percentage ε of the outer peripheral surface 8a at the second bend 8 can be defined by the following formula:

$$\varepsilon = \{(\text{length } D2 \text{ of outer peripheral surface} - \text{length } D1 \text{ of neutral surface})/(\text{length } D2 \text{ of outer peripheral surface})\} \times 100.$$

Examples

Inductors 1 having different thicknesses t of the second bend 8, different radii R1 of the inner peripheral surface, and different elongation percentages ε of outer peripheral surface were manufactured. Subsequently, the surface of plating layer of outer peripheral surface 8a of each second metal portion 4b was observed to determine the presence of cracks. In the manufactured examples and comparative examples of the inductor 1, which are collated in Table 1, the thickness t of the second bend 8 was changed in a range from 0.1 to 0.2 and the radius R1 of the inner peripheral surface was changed in a range from 0.1 to 0.246. In addition, the first distance (A) was set to be shorter than the length of side surface 2c of the main body measured in the direction orthogonally intersecting the bottom surface (that is, a height of the side surface 2c), and the second distance (B) was set to be shorter than a half of the distance between the opposite side surfaces of the main body. As a result, the elongation percentage ε of outer peripheral surface varied in a range from 1.59% to 14.24%. Table 1 shows observation results of surface cracks appearing on the surface of the plating layer 4c of the second bend 8 when the above parameters related to the second bend 8 were changed.

Materials used for manufacturing example inductors are as follows. The main body 2 was made of a composite material including magnetic powder made of a metallic magnetic substance containing iron and a binder made of epoxy resin. The metal body 4 used was a metal body including a conductive base metal of copper (in accordance with C1100RH of JIS H3100) and plating layers formed by nickel plating on one surface of the base metal and by semi-gloss tin plating on the nickel plating layer. The metal body 4 also includes a first metal portion 4a having a lateral length of 0.55 mm and a second metal portion 4b having a lateral length of 1.8 mm. In Examples 1 to 4 and Comparative Examples 1 and 2, the total thickness of the metal body 4 was 0.10 mm with the thickness of nickel plating being 0.5 to 1.0 μm and with the thickness of tin plating being 5 to 8 μm. In Examples 5 to 7, the total thickness of the metal body 4 was 0.12 mm with the thickness of nickel plating being 0.5 to 1.0 μm and with the thickness of tin plating being 5 to 8 μm. In Examples 8 and 9, the total thickness of the metal body 4 was 0.2 mm with the thickness of nickel plating being 0.5 to 1.0 μm and with the thickness of tin plating being 5 to 8 μm. The nickel used for plating exhibited a hardness (HV) of 100 to 600 and a tensile strength of 35 to 108 kg/mm$^2$, and the tin used for plating exhibited a hardness (HV) of 5 to 60.

As collated in Table 1, cracks occurred in the plating of Comparative Example 1 having an elongation percentage ε of outer peripheral surface of 13.64 and in the plating of Comparative Example 2 having an elongation percentage ε of outer peripheral surface of 14.24. On the other hand, cracks did not occur in the plating of Example 4 having an elongation percentage ε of outer peripheral surface of 12.83 and in the plating of Example 3 having an elongation percentage ε of outer peripheral surface of 10.47. It was also confirmed that cracks did not occur in other examples having an elongation percentage ε of outer peripheral surface of less than 10.47.

Figure 4A:
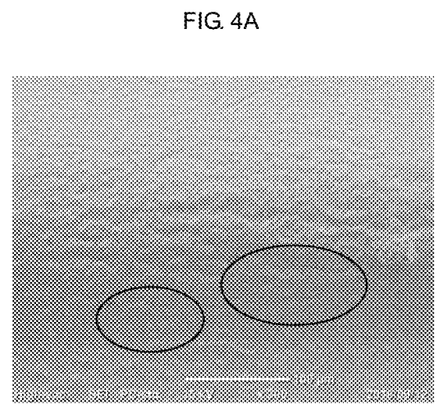
FIGS. 4A and 4B include example photographs showing surfaces of plating layers corresponding to a comparative example and an example in Table 1.
Figure 4B:
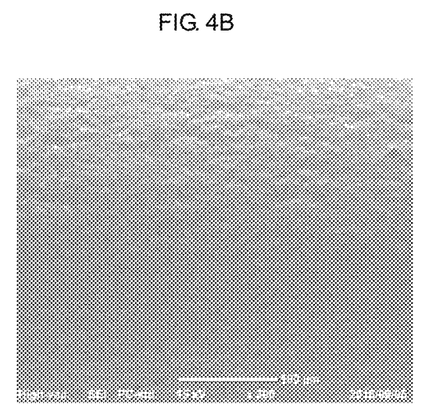

In the experiment, the presence of cracks in the plating was determined by using microphotographs of a scanning electron microscope (SEM). When the base metal of copper was exposed in an SEM photograph (of Comparative Example 2), which is shown in marked part in FIG. 4A, it was determined that cracks occurred in the plating. On the other hand, when the base metal of copper was not observed in an SEM photograph (of Example 3), which is shown in FIG. 4B, it was determined that cracks did not occur in the plating.

Consequently, it was found that cracks do not occur in the plating of the external terminals in the case of the elongation percentage ε of outer peripheral surface being 13% or less

TABLE 1

| | Thickness t of Second Bend (mm) | Radius R1 of Inner Peripheral Surface (mm) | Elongation Percentage ε of Outer Peripheral Surface (%) | Cracks in Plating |
|---|---|---|---|---|
| Example 1 | 0.1 | 0.2 | 6.77 | Not Generated |
| Example 2 | 0.1 | 0.2 | 10.1 | Not Generated |
| Example 3 | 0.1 | 0.18 | 10.47 | Not Generated |
| Example 4 | 0.1 | 0.15 | 12.83 | Not Generated |
| Comparative Example 1 | 0.1 | 0.12 | 13.64 | Generated |
| Comparative Example 2 | 0.1 | 0.1 | 14.24 | Generated |
| Example 5 | 0.12 | 0.24 | 10.35 | Not Generated |
| Example 6 | 0.15 | 0.2 | 1.59 | Not Generated |
| Example 7 | 0.15 | 0.2 | 2.9 | Not Generated |
| Example 8 | 0.2 | 0.1 | 9.24 | Not Generated |
| Example 9 | 0.2 | 0.246 | 10.31 | Not Generated | and cracks occur in the case of the elongation percentage ε of outer peripheral surface exceeding 13% when the first distance (A) is set to be shorter than the length of the side surface of the main body measured in the direction orthogonally intersecting the bottom surface and the second distance (B) is set to be shorter than a half of the distance between the opposite side surfaces of the main body.

According to the present embodiment, as described above, the inductor 1 includes a main body 2 having a bottom surface 2b, a top surface 2d positioned opposite to the bottom surface 2b, four side surfaces connected to the bottom surface 2b and the top surface 2d, a metal body 4 that includes a first metal portion 4a buried in the main body 2 and second metal portions 4b extending outward from respective opposite longitudinal ends of the first metal portion 4a. The second metal portions 4b are exposed from respective opposite side surfaces 2c of the main body 2. In the inductor 1, each second metal portion 4b is formed into a tabular shape having a first surface 4d with a plating layer 4c and a second surface 4e positioned opposite to the first surface 4d. Each second metal portion 4b is formed into an external terminal and includes a first bend 6 that is formed by bending the second metal portion 4b such that the second surface 4e opposes a corresponding one of the opposite side surfaces 2c of the main body 2 and also includes a second bend 8 that is formed by bending the second metal portion 4b such that the second surface 4e opposes the bottom surface 2b of the main body 2. When R1 denotes a curvature radius of an inner peripheral surface 8b of the second bend 8, t denotes a thickness of each second metal portion 4b at the second bend 8, and λ denotes a value determined based on the ratio R1 to t, λ is 0.3 in the case of R1/t being less than 0.5, or λ is 0.35 in the case of R1/t being in the range of 0.5 or more to less than 1.5 (i.e., from 0.5 to less than 1.5), or λ is 0.43 in the case of R1/t being in the range of 1.5 or more to less than 3.0 (i.e., from 1.5 to less than 3.0), or λ is 0.5 in the case of R1/t being 5.0 or more. A curvature radius R2 of a neutral surface 16 of bending of the second bend 8 is obtained from a formula: R2=R1+λ×t, and a curvature radius R3 of an outer peripheral surface 8a of the second bend 8 is obtained from a formula: R3=R1+t. When a first distance A is defined as a distance between an end 6a of the first bend 6 that is closer to a tip 4f of each second metal portion 4b and an end 8c of the second bend 8 that is closer to the first metal portion 4a and when a second distance B is defined as a distance between the tip 4f of each second metal portion 4b and an end 8d of the second bend 8 that is closer to the tip 4f of each second metal portion 4b, a length D1 of the neutral surface 16 is obtained by A+B+R2×2×π×90°/360°, and a total length D2 of the first distance A, the second distance B, and the outer peripheral surface 8a at the second bend 8 is obtained by A+B+R3×2×π×90°/360°. When an elongation percentage ε of the outer peripheral surface 8a is defined as {(the length D2 of the outer peripheral surface 8a−the length D1 of the neutral surface 16)/the length D2 of the outer peripheral surface 8a}×100 and the first distance A is set to be shorter than a length of the corresponding one of the opposite side surfaces 2c of the main body 2 measured in a direction orthogonally intersecting the bottom surface 2b and the second distance B is set to be shorter than a half of a distance between the opposite side surfaces 2c of the main body 2, the elongation percentage ε of the outer peripheral surface 8a is 1.59% or more and 13% or less (i.e., from 1.59% to 13%).

In the inductor 1 configured as above, cracks do not occur in the plating of each second bend 8 that curves closely around the corner formed by the bottom surface 2b of the main body 2 and each side surface 2c in the case in which the thickness t of the second bend 8 and the radius R1 of the inner peripheral surface 8b are adjusted in such a manner that the elongation percentage ε of the outer peripheral surface 8a, which is defined as {(length D2 of outer peripheral surface 8a-length D1 of neutral surface 16)/length D2 of outer peripheral surface 8a}×100, is set to be 13% or less while the first distance (A) is set to be shorter than the length of the side surface of the main body measured in the direction orthogonally intersecting the bottom surface and the second distance (B) is set to be shorter than a half of the distance between the opposite side surfaces of the main body. As a result, for example, when the inductor 1 is mounted onto a printed circuit board by soldering, the occurrence of soldering failure due to poor solder wettability can be suppressed.

In addition, in the inductor 1 configured as above, the gap 14 is formed between each first straight portion 10 and the corresponding side surface 2c of the main body 2. This can reduce the load born by the second metal portions 4b when the first bends are bent and thereby can reduce the likelihood of cracks occurring on the surfaces of the second metal portions 4b.

Moreover, in the inductor 1 configured as above, each second straight portion 12 is disposed parallel to the bottom surface of the recess 2a, which is the bottom surface 2b of the main body 2. This improves mountability of the inductor 1 and also improves the strength of fixation of second straight portion 12 of each second metal portion 4b to the main body 2.

Furthermore, in the inductor 1 configured as above, the lateral length of the first metal portion 4a and the lateral length of the first bend 6 of each second metal portion 4b are set to be shorter than the lateral length of the first straight portion 10, the second bend 8, and the second straight portion 12 of the second metal portion 4b. Accordingly, when the first bends 6 are formed by bending the metal body 4, the force required for the bending can be reduced, which results in a reduction in stress applied to the main body 2.

Furthermore, in the inductor 1 configured as above, the second metal portions 4b, which are portions of the metal body 4 taken out from respective side surfaces 2c of the main body 2, serve as external terminals. This eliminates the necessity of forming external terminals separately. The electrical contact area of each external terminal can be expanded by increasing the lateral length of part of the first straight portion 10, the second bend 8, and the second straight portion 12.

Furthermore, in the inductor 1 configured as above, the first distance A of each second metal portion 4b is set shorter than the length of the corresponding side surface 2c of the main body 2 measured in the direction orthogonally intersecting the bottom surface 2b. Accordingly, a portion of each second metal portion 4b between the end 6a of the first bend 6 that is the end closer to the tip 4f of the second metal portions 4b and the end 8c of the second bend 8 that is the end closer to the first metal portion 4a can be made as a straight portion, which enables the metal body 4 to be reliably nipped by dies during the bending process. In addition, in the inductor 1 configured as above, the second distance B of each second metal portion 4b is set to be shorter than a half of the distance between the opposite side surfaces 2c of the main body 2. This prevents two second straight portions 12 from coming into contact with each other and short-circuiting at the bottom surface 2b of the main body 2.

Furthermore, in the inductor 1 configured as above, the plating layer 4c is formed on the first surface 4d of the metal body 4, and the plating layer 4c includes the first layer that is formed of nickel (Ni) plating so as to be in contact with the base metal 4g and the second layer that is formed of tin (Sn) plating so as to cover the first layer.

The inductor 1 configured as above can have the second metal portions 4b functioning as external terminals and having an improved solder wettability, which enables reliable mounting of the inductor 1.

In the case of the elongation percentage ε being less than 1.59, the external terminals tend to project largely from the inductor and to increase the size of the inductor.

Manufacturing Method

Next, a method of manufacturing the inductor 1 according to the present embodiment will be described.

The method of manufacturing the inductor 1 includes the following steps:

(a) disposing the metal body 4 in a die;

(b) covering the first metal portion 4a with a composite material containing magnetic powder by filling the die with the composite material;

(c) pressing the composite material to obtain the main body 2 from which the second metal portions 4b are exposed at the side surfaces 2c and in which the first metal portion 4a is buried;

(d) forming the second bends 8 by bending the metal body 4 at positions a predetermined distance away from the ends of respective second metal portions 4b; and (e) forming the first bends 6 by bending the shorter lateral-length portions of respective second metal portions 4b located adjacent to the corresponding side surfaces 2c of the main body 2.

The step of forming the second bends 8 and the step of forming the first bends 6 will be described below.

Forming Second Bends 8

In the step of forming the second bends 8, the second metal portions 4b are bent by pushing dies against the first surface 4d and the second surface 4e of the second metal portions 4b at desired positions in such a manner that the second bends 8 are formed with the elongation percentage ε of outer peripheral surface becoming 13% or less. Here, a portion of each second metal portion 4b between the tip 4f of the second metal portion 4b and the end 8d of the second bend 8 that is the end closer to the tip 4f of the second metal portion 4b becomes the second straight portion 12 after bending. Similarly, a portion of each second metal portion 4b between the end of the first metal portion 4a and the end 8c of the second bend 8 that is the end closer to the first metal portion 4a becomes the first straight portion 10 after bending. The second bends 8 are formed without deforming these portions of the second metal portion 4b by, for example, pushing flat part of the dies against these portions.

Forming First Bends 6

In the step of forming the first bends 6, a die is pushed against the first surface 4d of each second metal portion 4b at a desired position while the main body 2 is fixed. The contact surface of the die to be in contact with the first surface 4d is flat. Subsequently, the die is moved in such a manner that the contact surface of the die and the corresponding side surface 2c of the main body 2 make a predetermined angle. The internal angle of each first bend 6 can be thereby formed as an obtuse angle.

Thus, the internal angle of each first bend 6 can be formed as an obtuse angle by using the above-described method.

In addition, by using the above-described method, a straight portion of each second metal portion 4b can be formed between the tip 4f of the second metal portion 4b and the end 8d of the second bend 8 that is the end closer to the tip 4f of the second metal portion 4b, and another straight portion of each second metal portion 4b can be formed between the end 6a of the first bend 6 that is the end closer to the tip 4f of the second metal portions 4b and the end 8c of the second bend 8 that is the end closer to the first metal portion 4a.

Second Embodiment

Next, an inductor 21 according to a second embodiment of the present disclosure will be described with reference to FIG. 5.

Figure 5:
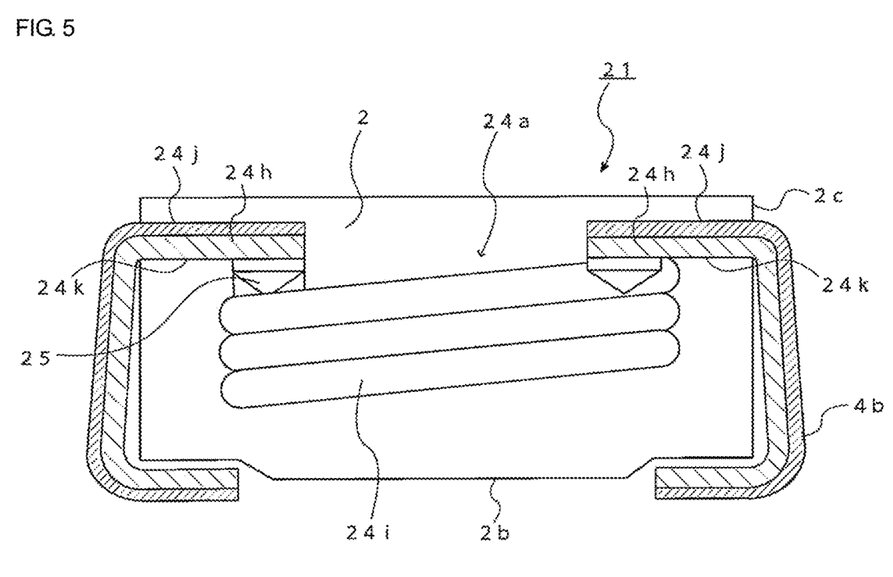
FIG. 5 is a cross-sectional view schematically illustrating an inductor according to a second embodiment of the present disclosure.

FIG. 5 is a cross-sectional view schematically illustrating the inductor 21 according to the second embodiment of the present disclosure. The cross section of FIG. 5 is taken at the same position as that of FIG. 2A. The structure of first metal portion of the inductor 21 according to the second embodiment is different from that of the inductor 1 according to the first embodiment.

Note that in FIG. 5, the same members as those of inductor 1 of the first embodiment are denoted by the same reference symbols.

A first metal portion 24a of the inductor 21 includes two tabular portions 24h and a coil portion 24i. The coil portion 24i is shaped into a coil having one or more windings. The coil portion 24i is formed by winding around a wire having a circular or a rectangular cross section. Similar to the first metal portion 4a of the first embodiment, each tabular portion 24h includes a first surface 24j having a plating layer and a second surface 24k positioned opposite to the first surface 24j. The tabular portions 24h are buried in the main body 2 in such a manner that the second surfaces 24k of the tabular portions 24h are disposed on a plane parallel to the bottom surface 2b of the main body 2 and the ends of the tabular portions 24h are spaced from each other in the longitudinal direction of the main body 2. The tabular portions 24h extend in the longitudinal direction of the main body 2. The coil portion 24i is disposed in a region near the second surfaces 24k of the tabular portions 24h so as to connect lead portions 25 of respective tabular portions 24h to each other. The portion of each tabular portion 24h that is exposed from the main body 2 is the same as that of the first embodiment, and the descriptions are not repeated here.

In the inductor 21 configured as above, the number of windings of the coil portion 24i can be changed to increase the inductance of the coil.

Embodiments of the present disclosure and configurations thereof have been described. Note that minor portions of each configuration disclosed can be modified and altered. Modifications, such as different combination of elements or change in the order of elements, can be made without departing from the claimed scope of the disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An inductor comprising:
  a main body having a bottom surface, a top surface positioned opposite to the bottom surface, four side surfaces connected to the bottom surface and the top surface;

a metal body that includes a first metal portion buried in the main body and second metal portions extending outward from respective opposite longitudinal ends of the first metal portion, the second metal portions being exposed from respective opposite side surfaces of the main body, wherein each of the second metal portion being a plate-like shape has a first surface with a plating layer and a second surface opposite to the first surface, each of the second metal portion defines an external terminal, includes a first bend that is formed by bending the second metal portion such that the second surface opposes a corresponding one of the opposite side surfaces of the main body, and includes a second bend that is formed by bending the second metal portion such that the second surface opposes the bottom surface of the main body, when R1 denotes a curvature radius of an inner peripheral surface of the second bend, t denotes a thickness of each second metal portion at the second bend, and $\lambda$ denotes a value determined based on the ratio R1 to t, such that $\lambda$ is 0.3 in a case of R1/t being less than 0.5, or $\lambda$ is 0.35 in a case of R1/t being in the range of 0.5 to less than 1.5, or $\lambda$ is 0.43 in a case of R1/t being in the range of 1.5 to less than 3.0, or $\lambda$ is 0.5 in a case of R1/t being 5.0 or more, a curvature radius R2 of a neutral surface of bending of the second bend is obtained from an equation R2=R1+$\lambda$×t, and a curvature radius R3 of an outer peripheral surface of the second bend is obtained from an equation R3=R1+t, when a first distance A is defined as a distance between an end of the first bend that is closer to a tip of each second metal portion and an end of the second bend that is closer to the first metal portion, and when a second distance B is defined as a distance between the tip of each second metal portion and an end of the second bend that is closer to the tip of each second metal portion, a length of the neutral surface is obtained by A+B+R2×2×$\pi$×90°/360°, and a total length of the first distance A, the second distance B, and the outer peripheral surface of the second bend is obtained by A+B+R3×2×$\pi$×90°/360°, and when an elongation percentage $\varepsilon$ of the outer peripheral surface is defined as {(the length of the outer peripheral surface−the length of the neutral surface)/the length of the outer peripheral surface}×100, the first distance A is set to be shorter than a height of the corresponding one of the side surfaces of the main body, and the second distance B is set to be shorter than a half of a distance between the opposite side surfaces of the main body, the elongation percentage $\varepsilon$ of the outer peripheral surface is 13% or less.

2. The inductor according to claim 1, wherein
the plating layer includes a first layer of nickel plating formed on a surface of a base metal made of copper and a second layer of tin plating formed on the first layer.

3. The inductor according to claim 1, wherein
the first metal portion having a plate-like shape has a first surface with a plating layer and a second surface opposite to the first surface,
the first metal portion is buried in the main body such that the second surface is substantially parallel to the bottom surface of the main body, and
the plating layer is disposed at an opposite side to the bottom surface of the main body.

4. The inductor according to claim 1, wherein
the first metal portion is shaped like a coil having one or more turns.

5. The inductor according to claim 3, wherein
a lateral length of each second metal portion at the first bend is substantially the same as a lateral length of the first metal portion,
a lateral length of each second metal portion at a position other than the first bend is longer than the lateral length of the first metal portion, and
the lateral length of each second metal portion at a position other than the first bend is substantially the same as or smaller than a lateral length of the main body.

6. The inductor according to claim 5, wherein
the main body has an approximate size of 2.5 mm by 2.0 mm by 1.0 mm.

7. The inductor according to claim 2, wherein
the first metal portion having a plate-like shape has a first surface with a plating layer and a second surface opposite to the first surface,
the first metal portion is buried in the main body such that the second surface is substantially parallel to the bottom surface of the main body, and
the plating layer is disposed at an opposite side to the bottom surface of the main body.

8. The inductor according to claim 7, wherein
a lateral length of each second metal portion at the first bend is substantially the same as a lateral length of the first metal portion,
a lateral length of each second metal portion at a position other than the first bend is longer than the lateral length of the first metal portion, and
the lateral length of each second metal portion at a position other than the first bend is substantially the same as or smaller than a lateral length of the main body.

9. The inductor according to claim 8, wherein
the main body has an approximate size of 2.5 mm by 2.0 mm by 1.0 mm.

10. The inductor according to claim 2, wherein
the first metal portion is shaped like a coil having one or more turns.

* * * * *